(12) United States Patent
Pieh et al.

(10) Patent No.: US 8,912,534 B2
(45) Date of Patent: Dec. 16, 2014

(54) TANDEM WHITE ORGANIC LIGHT EMITTING DEVICE

(71) Applicant: LG Display Co., Ltd., Seoul (KR)

(72) Inventors: Sung-Hoon Pieh, Seoul (KR); Chang-Wook Han, Seoul (KR); Hong-Seok Choi, Seoul (KR); Ki-Woog Song, Gyeonggi-do (KR); Hyung-June Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/857,279

(22) Filed: Apr. 5, 2013

(65) Prior Publication Data

US 2013/0264551 A1    Oct. 10, 2013

(30) Foreign Application Priority Data

Apr. 5, 2012   (KR) .................. 10-2012-0035336

(51) Int. Cl.
*H01L 35/24*    (2006.01)
*H01L 51/00*    (2006.01)
*H01L 51/50*    (2006.01)

(52) U.S. Cl.
CPC ........... *H01L 51/5056* (2013.01); *Y02T 90/168* (2013.01); *Y04S 30/12* (2013.01)
USPC ............... 257/40; 257/E51.026; 136/263

(58) Field of Classification Search
USPC ................... 257/40, E51.026; 136/263
See application file for complete search history.

(56) References Cited

U.S. PATENT DOCUMENTS

| | | | |
|---|---|---|---|
| 2006/0099447 A1* | 5/2006 | Lee et al. | 428/690 |
| 2007/0222376 A1* | 9/2007 | Ohsawa et al. | 313/506 |
| 2010/0288362 A1* | 11/2010 | Hatwar et al. | 136/263 |
| 2011/0014739 A1* | 1/2011 | Kondakov | 438/35 |
| 2011/0057178 A1* | 3/2011 | Shitagaki et al. | 257/40 |

* cited by examiner

*Primary Examiner* — Phuc Dang
(74) *Attorney, Agent, or Firm* — Morgan, Lewis & Bockius LLP

(57) ABSTRACT

A tandem white organic light emitting device having high efficiency and long lifespan by adjusting characteristics of a hole transport layer adjacent to a charge generation layer consisting of p-type and n-type charge generation layer is disclosed, the p-type charge generation layer is formed of organic materials only, and at least one organic material contained in the p-type charge generation layer has a LUMO level of −6.0 eV to −4.5 eV.

16 Claims, 9 Drawing Sheets

TANDEM WHITE ORGANIC LIGHT EMITTING DEVICE

This application claims the benefit of Korean Patent Application No. 10-2012-0035336, filed on Apr. 5, 2012, which is hereby incorporated by reference as if fully set forth herein.

BACKGROUND OF THE INVENTION

1. Field of the Invention

The present invention relates to a white organic light emitting device, and more particularly, to a tandem white organic light emitting device having high efficiency and long lifespan by adjusting characteristics of a hole transport layer adjacent to a charge generation layer.

2. Discussion of the Related Art

With the advent of the information age, the field of displays that visually express electric information signals has rapidly developed. Correspondingly, a variety of flat display devices having excellent performance, such as slim design, low weight, and low power consumption, have been developed and rapidly replaced conventional cathode ray tubes (CRTs).

Examples of flat display devices include liquid crystal display device (LCDs), plasma display panel devices (PDPs), field emission display devices (FEDs), and organic light emitting devices (OLEDs).

Among the aforementioned flat display devices, the OLED is considered most competitive because it does not need a separate light source and realizes a compact device design and vivid color reproduction.

Such an OLED essentially requires formation of an organic light emitting layer. In order to form the organic light emitting layer, a deposition method using a shadow mask has been conventionally used.

However, if a shadow mask is used in a large area, the shadow mask sags due to load thereof. Thus, it is difficult to use the shadow mask multiple times, and defects occur during formation of a pattern of an organic light emitting layer. Thus, methods of replacing the shadow mask are required.

As one of the methods of replacing the shadow mask, a tandem white organic light emitting device, hereinafter referred to as white organic light emitting device, has been proposed. The white organic light emitting device will be described.

The white organic light emitting device is characterized in that respective layers between an anode and a cathode are deposited without using a mask during formation of light emitting diodes, i.e., organic layers including an organic light emitting layer are sequentially deposited in a vacuum state by varying components thereof.

Meanwhile, in order to implement the white organic light emitting device, white light may be realized by mixing colors of light emitted from at least two light emitting layers. In this case, the white organic light emitting device includes different light emitting layers emitting a plurality of colors between the anode and the cathode. A charge generation layer is disposed between the light emitting layers, and a stack is distinguished according to each light emitting layer as a unit structure.

In the white organic light emitting device, light is not produced by use of a single material. Instead, the white organic light emitting device emits colored light through combination of colors emitted from a plurality of light emitting layers, which is disposed at different positions in the white organic light emitting device and includes light emitting materials exhibiting photoluminescence (PL) peaks at different wavelengths. A method of implementing a white organic light emitting device including a stack including a fluorescent light emitting layer and a phosphorescent light emitting layer which are sequentially stacked has been reported.

SUMMARY OF THE INVENTION

Accordingly, the present invention is directed to a tandem white organic light emitting device that substantially obviates one or more problems due to limitations and disadvantages of the related art.

However, conventional white organic light emitting devices as described above have the following problems.

A tandem white organic light emitting device includes a charge generation layer interposed between two different stacks. The charge generation layer performs transport of electrons or holes to adjacent stacks. However, in the tandem white organic light emitting device, holes or electrons of the charge generation layer may not be transported into the adjacent stacks. In this case, normal light emission may not be performed in an adjacent phosphorescent or fluorescent stack. In order to overcome such problem, a hole transport layer of a stack adjacent to the charge generation layer having a double layer structure including an exciton or electron blocking layer has been used. However, the double layer structure increases interface, complicates the manufacturing process, and increases obstacles for hole transport. Furthermore, the blocking layer may cause decrease in lifespan.

Accordingly, attempts have been made to reveal the cause of inhibition of injection of holes or electrons of the charge generation layer into adjacent stacks.

An object of the present invention is to provide a tandem white organic light emitting device having high efficiency and long lifespan by adjusting characteristics of a hole transport layer adjacent to a charge generation layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a tandem white organic light emitting device includes a first electrode and a second electrode opposite to each other, a charge generation layer including an n-type charge generation layer and a p-type charge generation layer stacked between the first electrode and the second electrode, a first stack disposed between the first electrode and the charge generation layer and including a first hole transport layer, a first light emitting layer emitting blue light, and a first electron transport layer, and a second stack disposed between the charge generation layer and the second electrode and including a second hole transport layer directly contacting the p-type charge generation layer and having a single layer structure, a second light emitting layer doped with a phosphorescent dopant to emit light with a longer wavelength than that of blue light, and a second electron transport layer. The p-type charge generation layer is formed of organic materials only, and at least one organic material contained in the p-type charge generation layer has a LUMO level of −6.0 eV to −4.5 eV. The second hole transport layer has a HOMO level different from the LUMO level of the at least one organic material contained in the p-type charge generation layer by 0.5 eV or less.

The p-type charge generation layer may include an organic dopant having a LUMO level of −6.0 eV to −4.5 eV, wherein the LUMO level is the same as a HOMO level of the second hole transport layer or different from the HOMO level of the second hole transport layer by 0.5 eV or less and an organic host having a HOMO level of −6.0 eV to −4.5 eV, wherein the HOMO level is the same as the HOMO level of the second hole transport layer or different from the HOMO level of the second hole transport layer by 0.5 eV or less. The organic host may be formed of the same material as is used to form the second hole transport layer.

The HOMO level of the organic host may have a greater absolute value than a LUMO level of the organic dopant.

The second hole transport layer may have a triplet energy level of 2.5 eV or greater.

The p-type charge generation layer may have a thickness of 100 Å to 300 Å.

The second hole transport layer may have a thickness of 300 Å to 700 Å.

The p-type charge generation layer may be formed of a single organic material having a LUMO level of −6.0 eV to −4.5 eV, wherein the LUMO level is the same as a HOMO level of the second hole transport layer or different from the HOMO level of the second hole transport layer by 0.5 eV or less.

The n-type charge generation layer may include a heterocyclic ring compound doped with a Group 1A metal or a Group 2A metal.

The n-type charge generation layer may have a thickness of 50 Å to 200 Å.

The doped metal may include lithium, sodium, magnesium, calcium, or cesium. An amount of the metal doped in the n-type charge generation layer may be in the range of 1% to 10% based on the total volume of the n-type charge generation layer.

The second hole transport layer and the second electron transport layer may have a triplet energy level greater than a triplet energy level of a host of the second light emitting layer by 0.01 eV to 1.2 eV.

The phosphorescent dopant of the second light emitting layer may include a yellowish-green phosphorescent dopant, a yellow phosphorescent dopant and a green phosphorescent dopant, or a red phosphorescent dopant and a green phosphorescent dopant.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a tandem white organic light emitting device according to the present invention will be described in detail with reference to the accompanying drawings.

Figure 1:
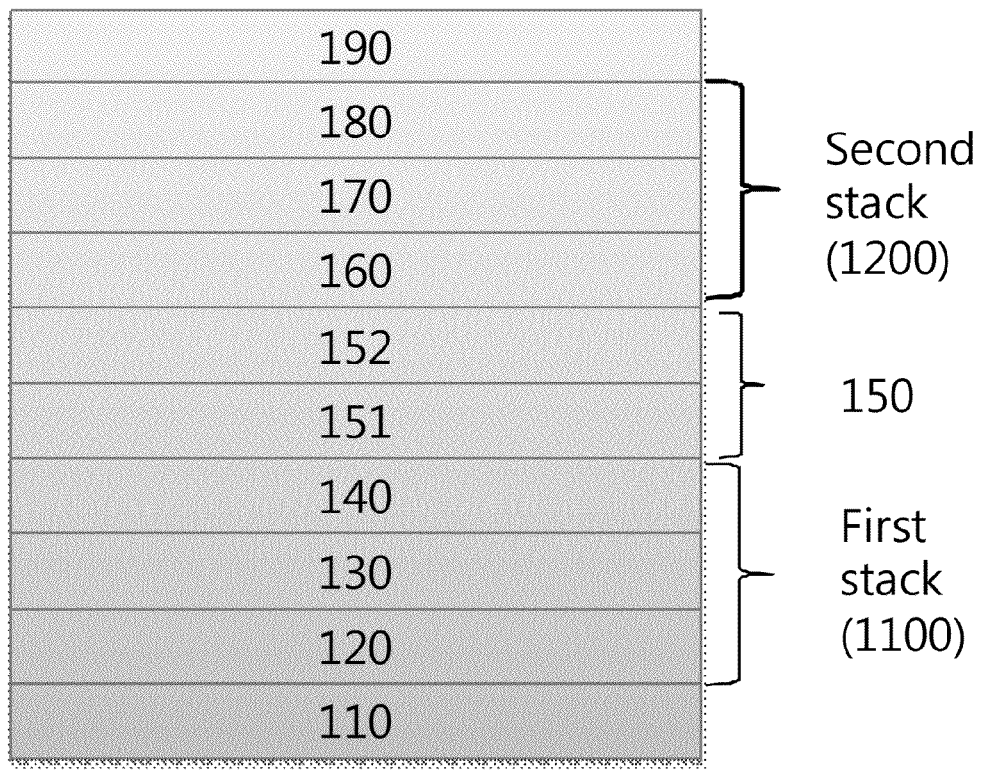
FIG. 1 is a cross-sectional view illustrating a tandem white organic light emitting device according to the present invention.

FIG. 1 is a cross-sectional view illustrating a tandem white organic light emitting device according to the present invention.

As illustrated in FIG. 1, the tandem white organic light emitting device according to the present invention includes a first electrode 110 and a second electrode 190 opposite to each other, a charge generation layer 150, a first stack 1100, and a second stack 1200. The charge generation layer 150 is disposed between the first electrode 110 and the second electrode 190 and includes an n-type charge generation layer 151 and a p-type charge generation layer 152 sequentially stacked. The first stack 1100 is disposed between the first electrode 110 and the charge generation layer 150 and includes a first hole transport layer 120, a first light emitting layer emitting blue light 130, and a first electron transport layer 140. The second stack 1200 is disposed between the charge generation layer 150 and the second electrode 190 and includes a second hole transport layer 160, which is a single layer directly contacting the p-type charge generation layer 152, a second light emitting layer 170 doped with a phosphorescent dopant to emit light having a longer wavelength than blue light, and a second electron transport layer 180.

In this regard, the p-type charge generation layer 152 is formed of only organic materials. At least one organic material contained in the p-type charge generation layer 152 has a lowest unoccupied molecular orbital (LUMO) level of −6.0 eV to −4.5 eV. A difference between the LUMO level of the organic material contained in the p-type charge generation layer 152 and a highest occupied molecular orbital (HOMO) level of the second hole transport layer 160 directly contacting the p-type charge generation layer 152 is 0.5 eV or less. Accordingly, hole transport from the p-type charge generation layer 152 to the second hole transport layer 160 is performed at an interface therebetween without any barriers. In addition, the single second hole transport layer 160 is formed of a material having electron blocking or exciton blocking properties so as to prevent electrons or exciton (or triplets) injected into the second light emitting layer 170 from diffusing into the charge generation layer 150. In addition, the p-type charge generation layer 152 has a thickness of 100 Å to 300 Å.

In this regard, a triplet energy level of the second hole transport layer 160 directly contacting the p-type charge generation layer 152 is 2.5 eV or greater.

The second hole transport layer 160 has a thickness of 300 Å to 700 Å and has an aromatic ring including, for example, C, N, H, O, and S. A tertiary aromatic amine substituent or a heterocyclic ring having N, O, and S is required to obtain hole-transporting characteristics. The second hole transport layer 160 may have both or one selected therefrom.

Meanwhile, the charge generation layer (CGL) 150 serves to control charge balance between the first stack 1100 and the second stack 1200 adjacent to each other and is also referred to as an intermediate connector layer (ICL). In this case, the charge generation layer 150 may be divided into an n-type charge generation layer 151 to assist injection of electrons into the first stack 1100 and a p-type charge generation layer 152 to assist injection of holes into the second stack 1200.

Here, the p-type charge generation layer 152 may be a single layer formed of an organic material. As occasion demands, the p-type charge generation layer 152 may be formed of the same material as that used to form the second hole transport layer 160, as a host, doped with a p-type organic dopant.

In the latter case, the material of the second hole transport layer 160 used as the host material of the p-type charge generation layer 152 may be a hole transporting material having electron or exciton blocking characteristics. In addition, the p-type organic dopant is an organic material selected from an aromatic ring having at least one cyanide (CN) group and at least one fluoride (F) group and an allyl compound. The organic material used as the p-type organic dopant is an organic material essentially including C, N, and F and selectively including hydrogen (H) without having a metal. Examples of the p-type organic dopant may include 2,2'-(perfluoronaphthalene-2,6-diylidene)dimalononitrile, 2,2'-(2,5-dibromo-3,6-difluorocyclohexa-2,5-diene-1,4-diylidene)dimalononitrile, (2E,2'E,2"E)-2,2',2"-(cyclopropane-1,2,3-triylidene)tris(2-(2,6-dichloro-3,5-difluoro-4-(trifluoromethyl)phenyl)acetonitrile), or 4,4',4"-cyclopropane-1,2,3-triylidenetris(cyanomethane-1-yl-1-ylidene)tris(2,3,5,6-tetrafluorobenzonitrile).

In addition, metal doped in the n-type charge generation layer 151 may be a Group 1A element (alkali metal) or a Group 2A element (alkaline earth metal). For example, the metal may be selected from the group consisting of lithium (Li), sodium (Na), magnesium (Mg), calcium (Ca), and cesium (Cs).

As occasion demands, the n-type charge generation layer 151 may be formed by injection of an n-type organic dopant thereinto instead of doping with a metal.

Examples of the n-type dopant may include $Cr_2hpp_4$ (hpp: 1,3,4,6,7,8-hexahydro-2H-pyrimido[1,2-a]pyrimidonate), $Fe_2hpp_4$, $Mn_2hpp$, $Co_2hpp_4$, $Mo_2hpp_4$, $W_2hpp_4$, $Ni_2hpp_4$, $Cu_2hpp_4$, $Zn_2hpp_4$, and $W(hpp)_4$. In addition, organic dopant compounds such as 4,4',5,5'-tetracyclohexyl-1,1',2,2',3,3'-hexamethyl-2,2',3,3-tetrahydro-1H,1'H-2,2'-biimidazole, 2,2'-diisopropyl-1,1',3,3'-tetramethyl-2,2',3,3',4,4',5,5',6,6',7,7'-dodecahydro-1H,1'H-2,2'-bibenzo[d]imidazole, 2,2'-diisopropyl-4,4',5,5'-tetrakis(4-methoxyphenyl)-1,1',3,3'-tetramethyl-2,2',3,3'-tetrahydro-1H,1'H-2,2'-biimidazole, 2,2'-diisopropyl-4,5-bis(2-methoxyphenyl)-4',5'-bis(4-methoxyphenyl)-1,1',3,3'-tetramethyl-2,2',3,3'-tetrahydro-1H,1'H-2,2'-biimidazole), or 2,2'-diisopropyl-4,5-bis(2-methoxyphenyl)-4',5'-bis(3-methoxyphenyl)-1,1',3,3'-tetramethyl-2,2',3,3'-tetrahydro-1H,1'H-2,2'-biimidazole may be used as the n-type dopant.

In addition, the amount of the metal or n-type organic dopant doped in the n-type charge generation layer 151 may be in the range of 1% to 10%, preferably 2% to 8%, based on the total volume of the n-type charge generation layer, thereby improving transport efficiency of electrons or holes into adjacent stacks and preventing lateral leakage thereof due to conductivity.

In addition, the metal may be doped in the n-type charge generation layer 151 to a thickness of 50 Å to 200 Å, preferably, about 100 Å to 150 Å. The thickness is also selected in order to prevent lateral leakage of the n-type charge generation layer 151 and improve transport efficiency of carriers.

The n-type charge generation layer 151 functions as an electron transport and electron injection layer for the first stack 1100. The n-type charge generation layer 151 is formed of an electron transporting material, as a main material, doped with an alkali metal or alkaline earth metal.

For example, the n-type charge generation layer 151 may have a fused aromatic ring including a hetero ring as the electron transporting material.

Meanwhile, in the second stack 1200 emitting phosphorescent light, the second hole transport layer 160 and the second electron transport layer 180 have triplet energy levels greater than that of a host contained in the second light emitting layer 170 by 0.01 eV to 1.2 eV in order to prevent triplet excitons in an excited state from being injected into the second hole transport layer 160 or the second electron transport layer 180 and confine the triplet excitons within the second light emitting layer 170.

In addition, the first stack 1100 emitting blue fluorescent light is a high efficiency and long lifespan device based on triplet-triplet annihilation (TTA).

That is, the first stack 1100 improves a restrictive internal quantum efficiency (IQE) of a fluorescent device from 25% to about 50% due to delayed fluorescence through TTA. Accordingly, the device is designed such that TTA efficiently occurs in the first light emitting layer 130 for improvement of IQE through TTA.

That is, transfer from triplets to singlets is more efficiently conducted through TTA as singlet-triplet exchange energy ΔEst of each of the host and the dopant of the first light emitting layer 130 decreases. In order to efficiently confine triplet excitons within the first light emitting layer 130, triplet energy levels of the first hole transport layer 120 and the second hole transport layer 140 need to be greater than a triplet energy level of the fluorescent host. A high-efficiency blue fluorescent stack may be obtained by optimizing carrier mobility of the first hole transport layer 120 and the second hole transport layer 140 under the above-mentioned conditions.

In addition, the second stack 1200 is designed to apply a phosphorescent dopant, such as a yellow-green or yellowish-green phosphorescent dopant, a mixed dopant including yellow and green phosphorescent dopants, or a mixed dopant including red and green phosphorescent dopants, to a mixed host including a hole transporting host and an electron transporting host.

In this case, the first electrode 110 functions as an anode, and the second electrode 190 functions as a cathode. The first electrode 110 may be a transparent electrode, and the second electrode 190 may be a reflective electrode. Alternatively, the first electrode 110 may be a reflective electrode, and the second electrode 190 may be a transparent electrode.

As occasion demands, a hole injection layer may further be disposed between the first electrode 110 and the first hole transport layer 120, and an electron injection layer may further be disposed between the second electron transport layer 180 and the second electrode 190.

In addition, while the second hole transport layer 160 has a single layer structure, the first hole transport layer 120, the first electron transport layer 140, and the second electron transport layer 180 may respectively have a single layer structure as illustrated in FIG. 1 or a multilayer structure. In addition, the single layer may be formed by mixing or codeposition of a plurality of materials with different functions. In addition, if required, each of the hole transport layer or the electron transport layer may be integrally formed with a corresponding stack thereof.

Such a white organic light emitting device realizes white light via mixing effect of blue light emitted from the first light emitting layer 130 of the first stack 1100 and phosphorescent light emitted from the second stack 1200. The color of light emitted from the second stack 1200 is determined by a phosphorescent dopant contained in the second light emitting layer 170, for example, a single yellow-green or yellowish-green phosphorescent dopant, or a mixed dopant including a yellow phosphorescent dopant and a green phosphorescent dopant or a mixed dopant including a phosphorescent dopant and a green phosphorescent dopant. However, any other phosphorescent dopant may also be used, if the phosphorescent dopant is capable of realizing white light when mixed with the blue light emitted from the first stack 110.

A blue fluorescent material or a blue phosphorescent material may be used in the first light emitting layer 130. However, the following experiments were conducted using a blue fluorescent material in consideration of characteristics of materials developed to date.

In this regard, the second light emitting layer 170 includes a host, as a main material, in addition to the phosphorescent dopant. The host may be a single host or a mixed host including at least two hosts to improve hole transporting or electron transporting capabilities. In order to emit phosphorescent light, the second light emitting layer 170 is formed by doping the phosphorescent dopant to about 15%.

Meanwhile, the first electrode 110 illustrated in FIG. 1 constitutes an anode as a transparent electrode formed of ITO, or the like, and the second electrode 190 constitutes a cathode as a reflective electrode formed of Al.

However, the present invention is not limited thereto, and the first stack 1100 and the second stack 1200 may be reversely located. That is, the first stack that is a blue fluorescent stack may be disposed at an upper portion, and the second stack that is a phosphorescent stack may be disposed at a lower portion. The thickness of each layer may vary according to the locations of the stacks.

In addition, the first and second stacks may be sequentially stacked on the first electrode 110 deposited on a substrate (not shown). Alternatively, after depositing the second electrode 190, the second stack and the first stack may be stacked thereon in the opposite order.

One of the first electrode 110 and the second electrode 190 may be a transparent electrode formed of a material selected from the group consisting of ITO, IZO, ITZO, and AZO, and the other is a reflective material formed of Al, Mg, or the like.

According to the present invention, characteristics of the tandem white organic light emitting device changing in accordance with characteristics of the second hole transport layer adjacent to the p-type charge generation layer were observed through the following experiments, resulting in optimizing the interface between the charge generation layer and the second hole transport layer.

In the following experiments, a blue fluorescent layer was used as a fluorescent light emitting layer of the first stack, and a yellow-green phosphorescent layer that emits yellow-green phosphorescent light with a longer wavelength than blue light was used as a light emitting layer of the second stack (phosphorescent stack) with reference to the cross-sectional view of FIG. 1. The thicknesses of the layers and amounts of dyes or dopants contained therein were adjusted such that white light is produced by mixing light emitted from the blue fluorescent layer and light emitted from the phosphorescent light emitting layer.

Figure 2:
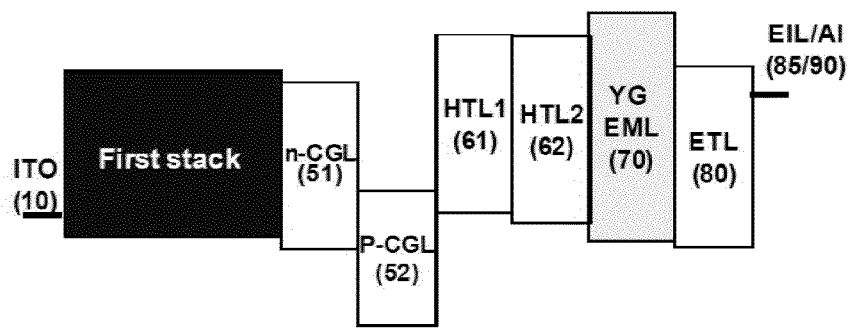
FIG. 2 is a diagram illustrating device A compared with a tandem white organic light emitting device according to the present invention.
Figure 3:
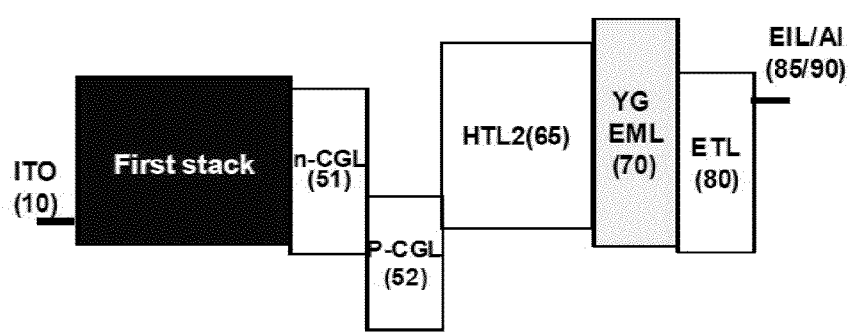
FIG. 3 is a diagram illustrating device B compared with a tandem white organic light emitting device according to the present invention.

FIG. 2 is a diagram illustrating device A compared with a tandem white organic light emitting device according to the present invention. FIG. 3 is a diagram illustrating device B compared with a tandem white organic light emitting device according to the present invention. Table 1 below shows efficiencies of devices A and B. The experiments were performed under the condition of a current density of 10 mA/cm$^2$.

FIGS. 2 and 3 respectively show a HOMO-LUMO energy band gap of each device, particularly, each layer. Here, the first stack is schematically illustrated.

As illustrated in FIGS. 2 and 3, comparative devices A and B have the same structure except for a second hole transport layer adjacent to a p-type charge generation layer 5. Both devices A and B have a first electrode 10, a first stack (blue fluorescent stack), an n-type charge generation layer 51, a p-type charge generation layer 52, a second light emitting layer 70, an electron transport layer 80, an electron injection layer 85, and a second electrode 90. That is, in comparative device A, the second hole transport layer has a double layer structure formed of different materials. The second hole transport layer includes a first layer (HTL1) 61 formed of a hole transporting material such as NPD and a second layer (HTL2) 62 formed of an electron or exciton blocking material. In comparative device B, the second hole transport layer 65 has a single layer structure formed of a single electron or exciton blocking material. In this case, the second hole transport layer 65 is formed of the same material as that of the second layer 62 of comparative device A to a thickness corresponding to the total thickness of the first and second layers 61 and 62. As illustrated in FIG. 2, the second layer 62 has a relatively slightly lower HOMO-LUMO range than the first layer 61.

In addition, in the experiments, the second layer 62 of comparative device A is formed of the same material as the hole transport layer 65 of comparative device B. In this case, the p-type charge generation layer 52 of comparative device B has a LUMO level of −6.0 eV to −4.5 eV and is formed of a single organic material, such that a difference between the HOMO level of the second hole transport layer 65 and the LUMO level is 0.5 eV or less.

TABLE 1

| ID | HTL1 | HTL2 | Volt | Cd/A | EQE(%) | CIEx | CIEy |
|---|---|---|---|---|---|---|---|
| Device A | ○ | ○ | 7.3 | 74.8 | 30.6 | 0.320 | 0.325 |
| Device B | X | ○ | 11.1 | 63.6 | 27.5 | 0.303 | 0.304 |

As shown in Table 1, device A has better characteristics than device B in terms of driving voltage, luminance, and external quantum efficiency. In addition, with regard to color coordinate characteristics, white light of the second stack of device B has slightly lower purity of wavelength than that of device A.

Figure 4:
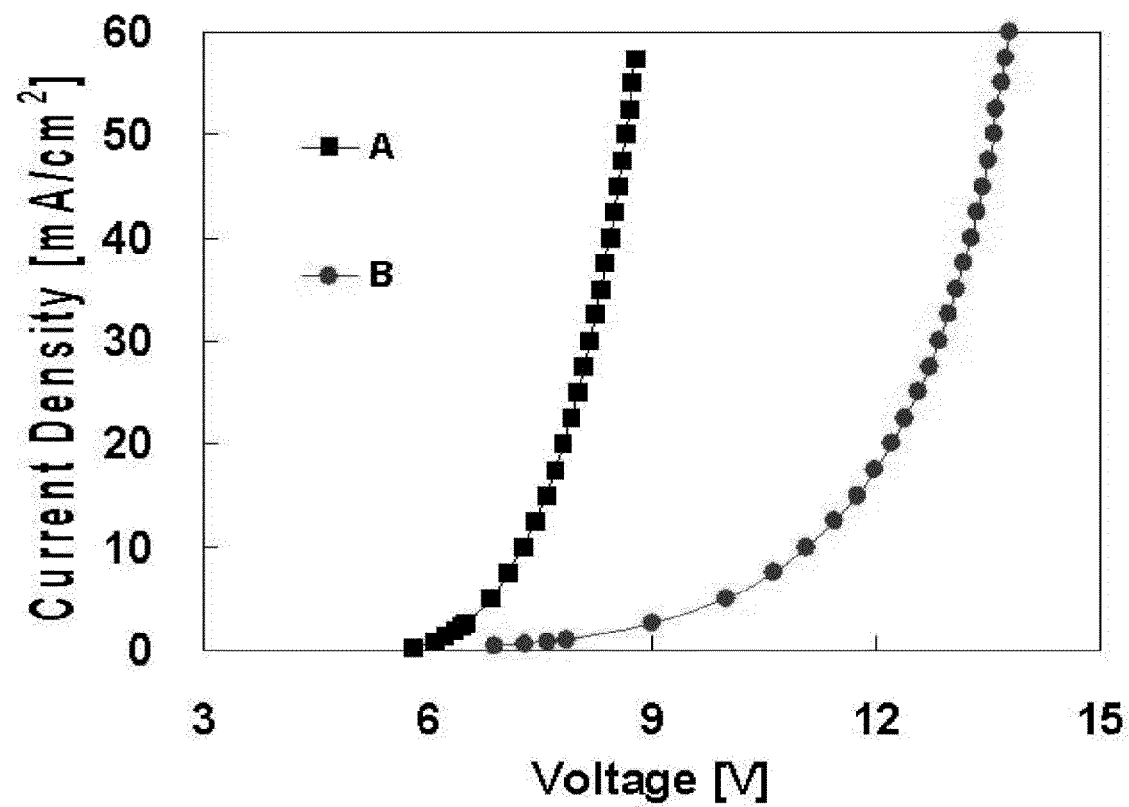
FIG. 4 is a graph illustrating current densities of devices A and B with respect to driving voltage.

FIG. 4 is a graph illustrating current densities of devices A and B with respect to driving voltage.

As illustrated in FIG. 4, as driving voltage increases, current density increases. However, the driving voltage of device B is greater than that of device A to obtain the same current density. In this regard, as illustrated in Table 1, at the same 10 mA/cm$^2$, a driving voltage of 7.3 V was required for device A, and a driving voltage of 11.1V was required for device B. Accordingly, it is numerically confirmed that driving voltage required for device B is greater than that of device A.

Such driving voltage difference between devices A and B at the same current density may be analogized as in the following. That is, the driving voltage requirements of device B are greater than those of device A due to high HOMO-LUMO level difference between the hole transport layer 65 having a single layer and the p-type charge generation layer 52 and due to a high barrier at an interface between the p-type charge generation layer 52 and the hole transport layer 65 adjacent thereto caused by structural difference between materials used to form the p-type charge generation layer 52 and the hole transport layer 65.

Figure 5:
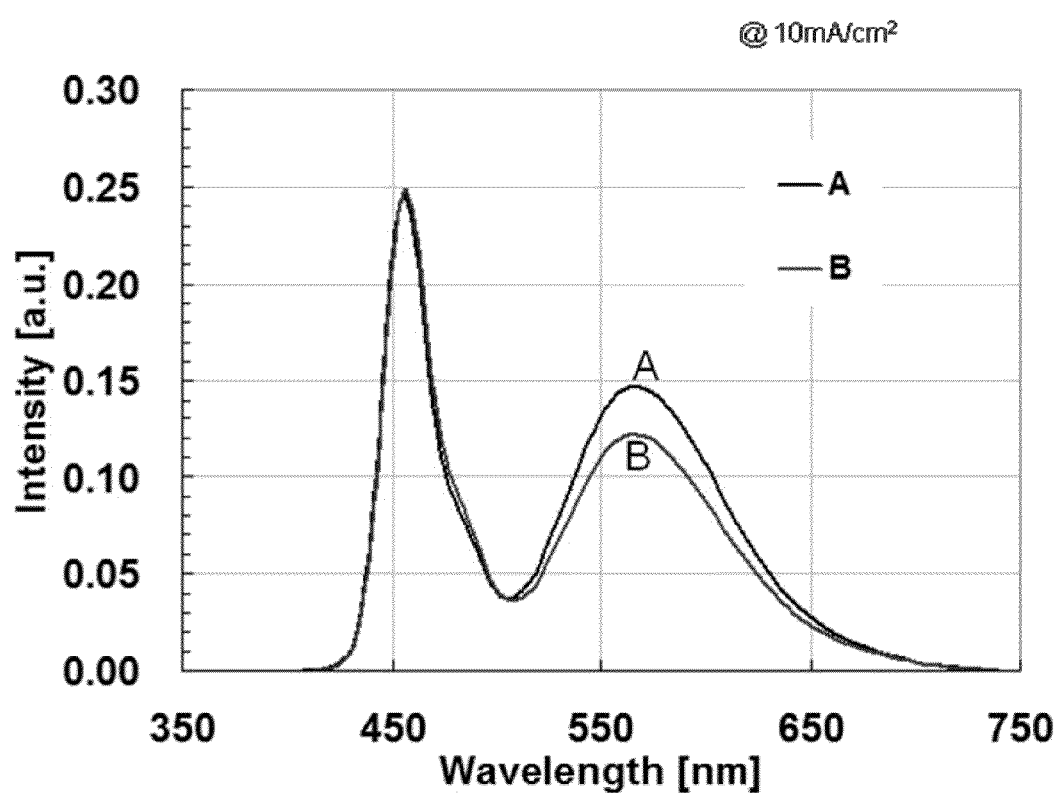
FIG. 5 is a graph illustrating light intensities of devices A and B with respect to wavelength.

FIG. 5 is a graph illustrating light intensities of devices A and B with respect to wavelength.

As illustrated in FIG. 5, since devices A and B respectively include organic layers having the same thicknesses between the first electrode and the second electrode, cavity characteristics of both devices A and B are identical to each other. Accordingly, main peaks of devices A and B are observed at the same position. However, the phosphorescent device of the second stack of device B is reduced due to increase in driving voltage and carrier imbalance, resulting in decreased efficiency.

Figure 6:
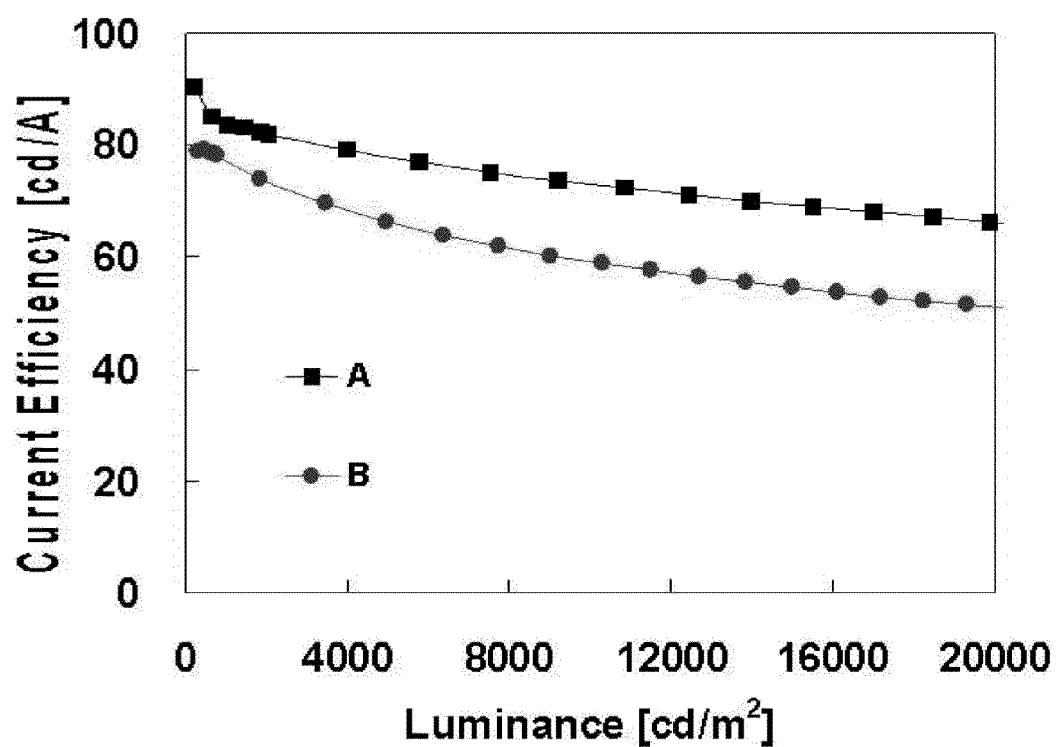
FIG. 6 is a graph illustrating current efficiencies of devices A and B with respect to luminance.

FIG. 6 is a graph illustrating current efficiencies of devices A and B with respect to luminance.

Referring to FIG. 6, as described above, device B has lower current efficiency than device A at the same luminance.

Figure 7:
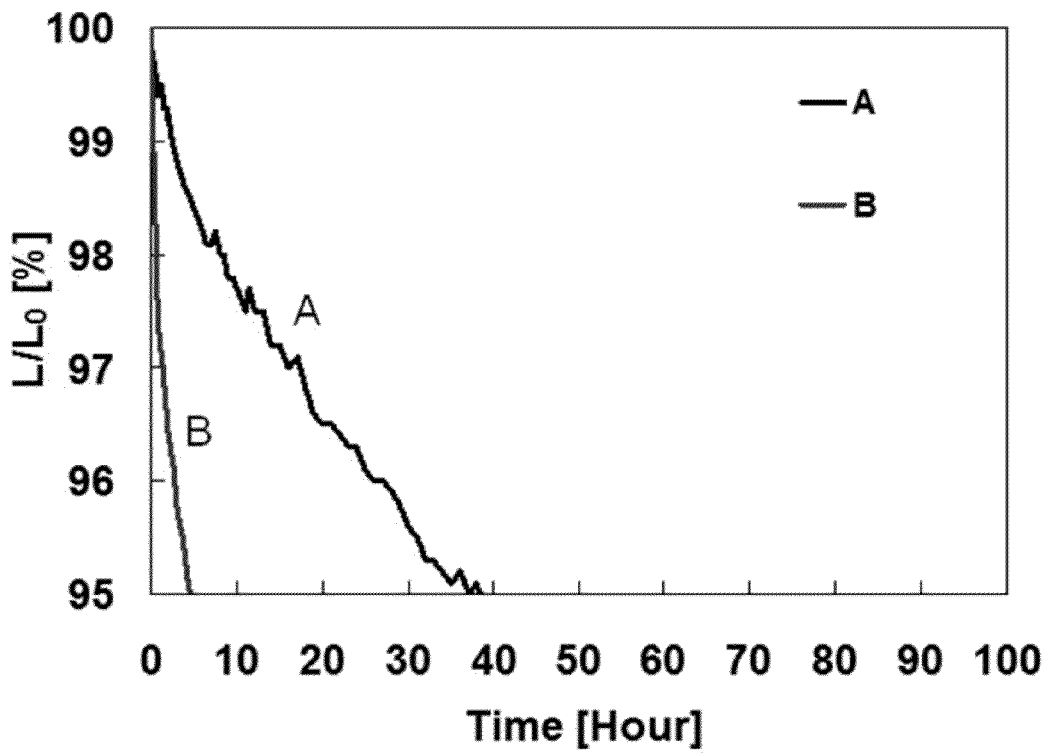
FIG. 7 is a graph illustrating luminance efficiencies of devices A and B with respect to time.

FIG. 7 is a graph illustrating luminance efficiencies of devices A and B with respect to time.

Referring to FIG. 7, change of a ratio of luminance L to initial luminance L0 was observed with time at a current density of 50 mA/cm$^2$. Reduction of the L/L0 ratio of device B to 95% took about 5 hours, which is about ⅛ that of device A, which took about 40 hours.

Hereinafter, a tandem white organic light emitting device according to the present invention having higher efficiency and longer lifespan than device A will be described.

Figure 8:
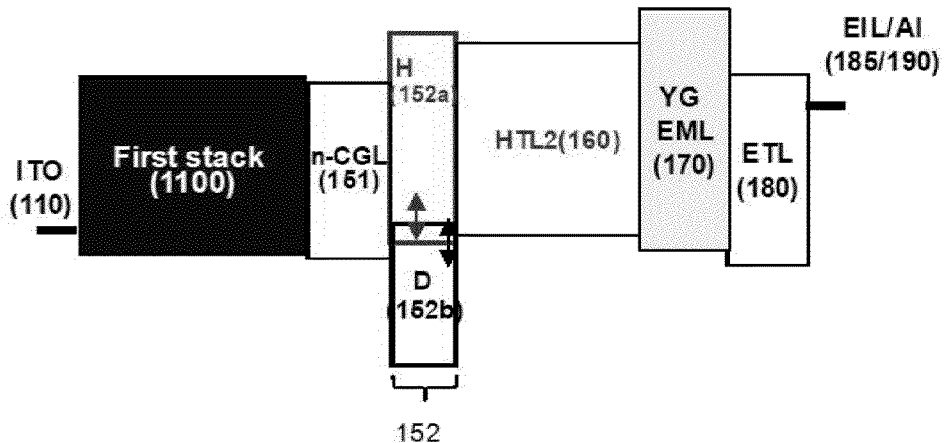
FIG. 8 is a diagram illustrating a tandem white organic light emitting device D according to the present invention.
Figure 9:
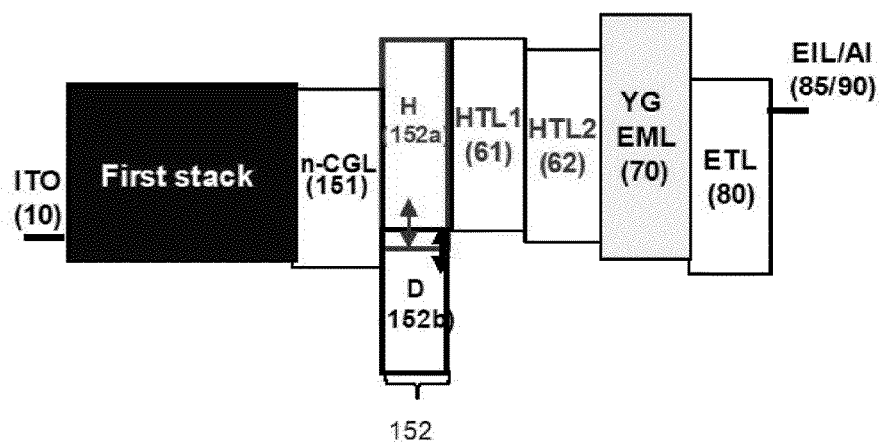
FIG. 9 is a diagram illustrating device C compared with the tandem white organic light emitting device D of FIG. 8.

FIG. 8 is a diagram illustrating a tandem white organic light emitting device D according to the present invention. FIG. 9 is a diagram illustrating device C compared with the tandem white organic light emitting device D of FIG. 8.

As illustrated in FIG. 8, the tandem white organic light emitting device D according to the present invention includes a p-type charge generation layer 152, which includes an organic dopant D:152b having a LUMO level of −6.0 eV to −4.5 eV and having a difference of 0.5 eV or less from a HOMO level of a second hole transport layer 160 and an organic host H:152a having a HOMO level of −6.0 eV to −4.5 eV and having a difference of 0.5 eV or less from a HOMO level of the second hole transport layer 160. In this case, the organic host may be formed of the same material as that of the second hole transport layer 160.

Except for the p-type charge generation layer 152, the other constituent elements of device D including a first electrode 110, a first stack unit 1100, an n-type charge generation layer 151, a second hole transport layer 160, a second light emitting layer 170, a second electron transport layer 180, a second electron injection layer 185, and a second electrode 190 are the same as those of device B illustrated in FIG. 3. Thus, a detailed description thereof will not be given.

Experiments shown in Table 2 were performed under the condition that the organic host 152a is formed of the same material as that of the second hole transport layer 160. However, the present invention is not limited thereto, and any other material capable of providing the energy level shown in FIG. 8 may also be used.

In addition, as illustrated in FIG. 8, in the p-type charge generation layer 152, the HOMO level of the organic host 152a may partially overlap the LUMO level of the organic dopant 152b at the boundary thereof, such that the absolute value of the HOMO level of the organic host 152a is greater than that of the LUMO level of the organic dopant 152b. Alternatively, as occasion demands, the energy levels thereof may be designed such that the HOMO-LUMO levels may be slightly spaced apart from each other. The LUMO level of the organic dopant 152b and the HOMO level of the organic host 152a may be designed to have a difference of 0.5 eV or less from the HOMO level of the second hole transport layer 160. As a result, holes may be efficiently injected by forming the second hole transport layer 160 using a single layer having high blocking characteristics and adjusting the HOMO levels of the organic host 152a of the p-type charge generation layer 152 and the second hole transport layer 160 to be similar to each other. In addition, by preventing diffusion of triplet excitons from the second light emitting layer 170 into the second hole transport layer 160 and the charge generation layer 150, decrease in efficiency may be inhibited.

The LUMO level of the organic dopant and the HOMO level of the organic host may vary within a range illustrated in FIG. 8 with arrows.

FIG. 9 is a diagram illustrating device C compared with the tandem white organic light emitting device D of FIG. 8, in which the second hole transport layer is divided into a first layer 61 and a second layer 62.

Particularly, devices C and D are compared with each other with reference to Table 2.

TABLE 2

| ID | HTL1 | HTL2 | Volt (V) | Cd/A | EQE(%) | CIEx | CIEy |
|---|---|---|---|---|---|---|---|
| Device C | ○ | ○ | 7.2 | 73.4 | 30.3 | 0.318 | 0.323 |
| Device D | X | ○ | 7.2 | 73.9 | 30.4 | 0.318 | 0.322 |

As shown in Table 2, referring to driving voltage, luminance, external quantum efficiency, and color coordinates at a current density of 10 mA/cm$^2$, the tandem white organic light emitting device D according to the present invention has the same or similar driving voltage and CIEx coordinates and improved luminance (Cd/A) and external quantum efficiency (EQE) in comparison with comparative device C. In addition, the CIEy coordinate values of device C and the tandem white organic light emitting device D are respectively 0.323 and 0.322 while both the first and second stacks emit light. Accordingly, devices C and D have similar purity of wavelength of white light.

That is, efficiency of device D is the same as or slightly greater than that of device C. Color coordinates of devices C and D are similar to each other.

Figure 10:
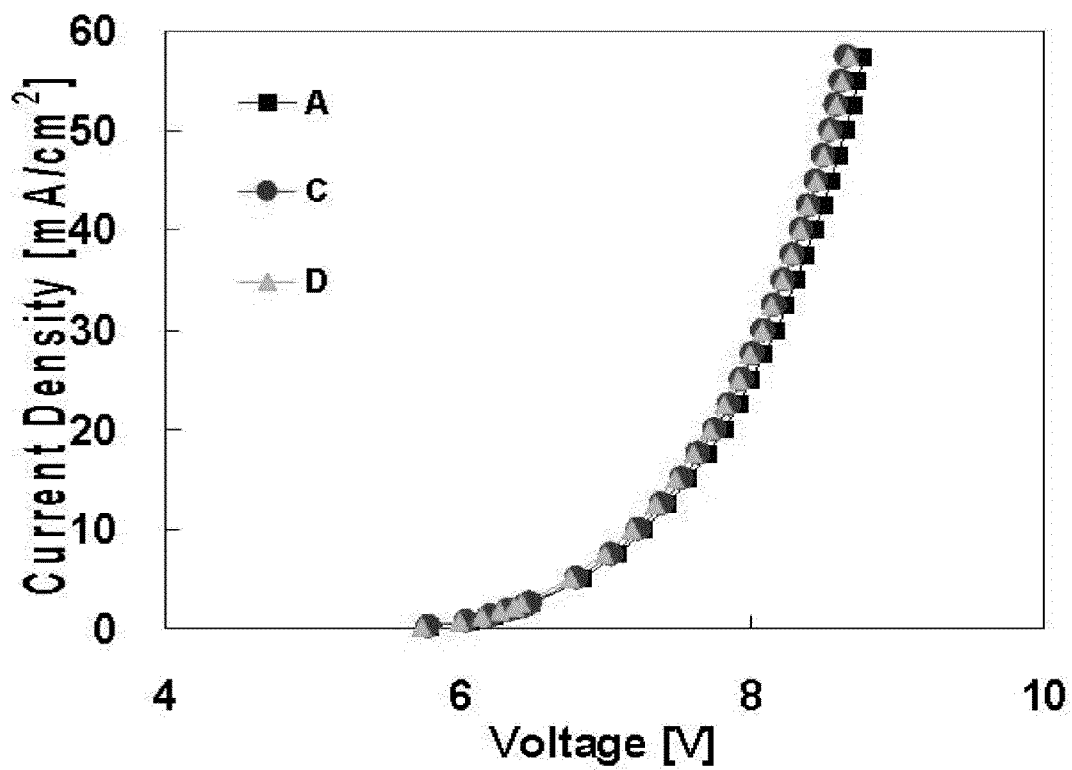
FIG. 10 is a graph illustrating current densities of devices A, C, and D with respect to driving voltage.

FIG. 10 is a graph illustrating current densities of devices A, C, and D with respect to driving voltage.

As shown in Table 2 and FIG. 10, devices A, C, and D had similar characteristics at a current density of 10 mA/cm². However, it is observed that as driving voltage increases, device D's current density almost becomes located at the uppermost position with regard to driving voltage on the graph. This indicates that current density efficiency is improved as driving voltage increases.

Figure 11:
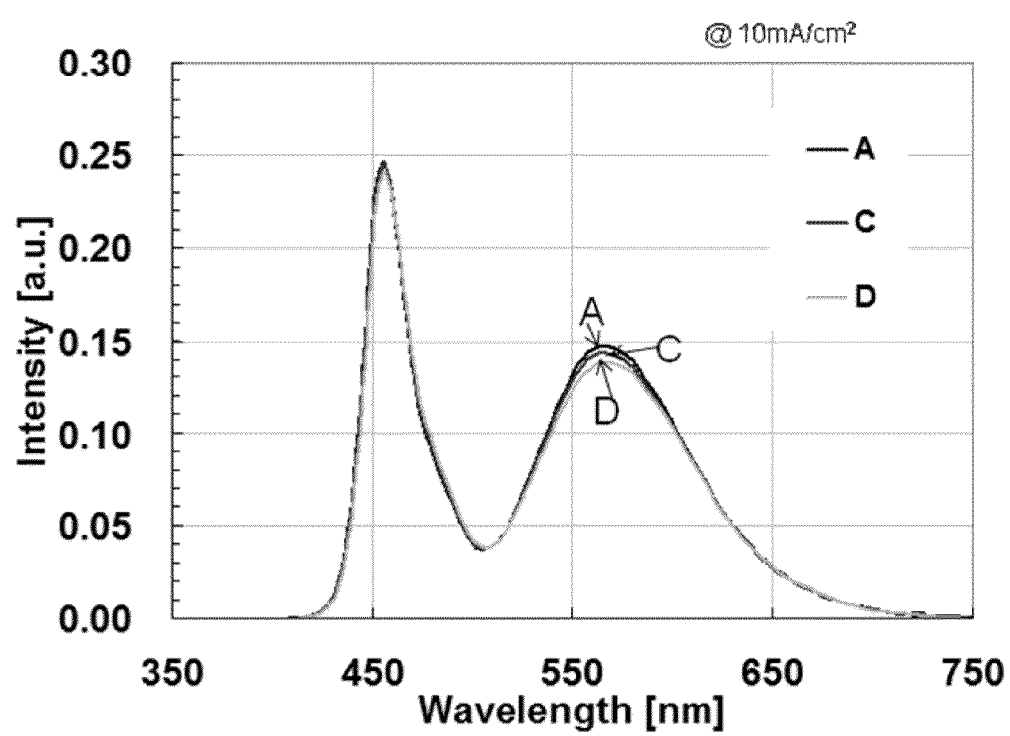
FIG. 11 is a graph illustrating light intensities of devices A, C, and D with respect to wavelength.

FIG. 11 is a graph illustrating light intensities of devices A, C, and D with respect to wavelength.

As illustrated in FIG. 11, as devices A, C, and D respectively include organic layers having the same thicknesses between the first electrode 110 and the second electrode 190, cavity characteristics of devices A, C, and D are the same. Accordingly, main peaks of devices A, C, and D are observed at the same position. EL peaks of the second stack of devices A, C, and D are similar differently from device B described above. This indicates that device D has optimized hole transporting efficiency without increasing driving voltage since the p-type charge generation layer includes the organic host and the organic dopant having the above-described HOMO-LUMO characteristics.

Figure 12:
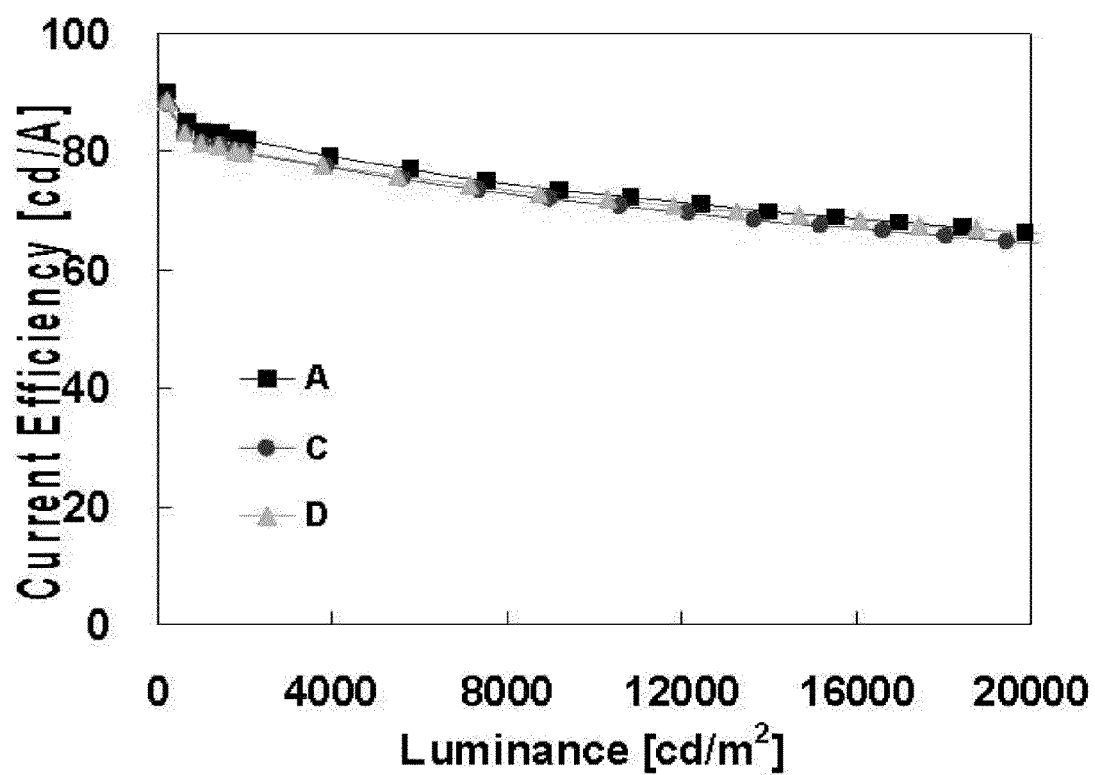
FIG. 12 is a graph illustrating current efficiencies of devices A, C, and D with respect to luminance.

FIG. 12 is a graph illustrating current efficiencies of devices A, C, and D with respect to luminance.

Referring to current efficiency according to luminance as illustrated in FIG. 12, device D has the highest current efficiency at the same luminance although devices A, C, and D have similar current efficiencies.

Figure 13:
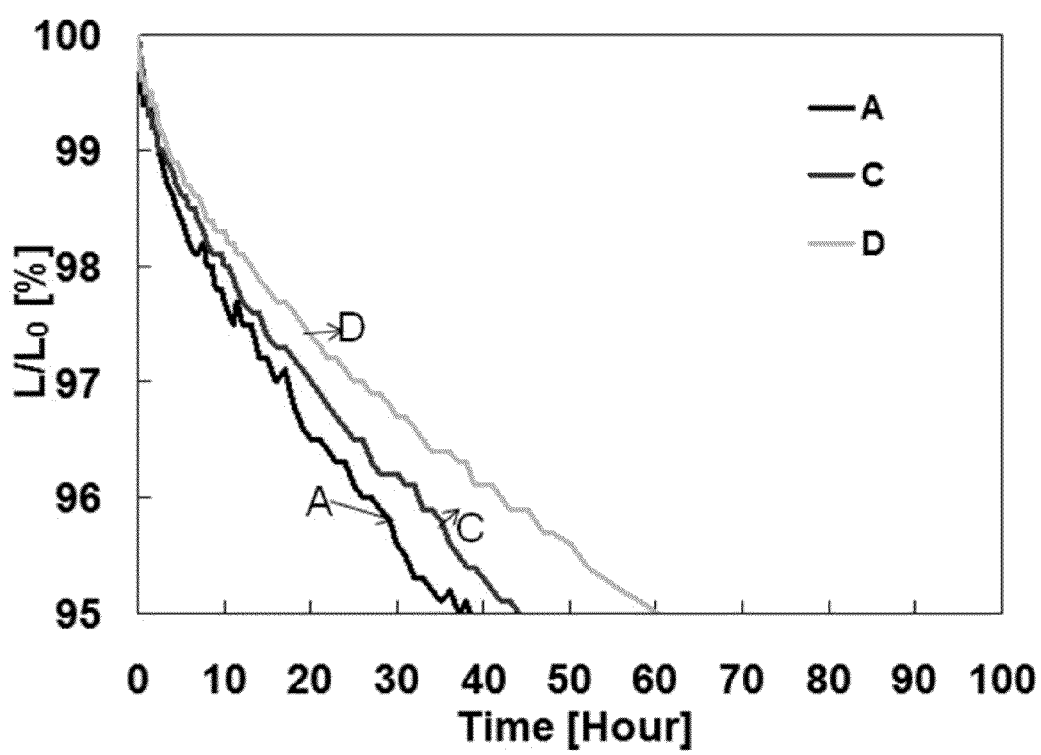
FIG. 13 is a graph illustrating luminance efficiencies of devices A, C, and D with respect to time.

FIG. 13 is a graph illustrating luminance efficiencies of devices A, C, and D with respect to time.

Referring to FIG. 13, change of a ratio of luminance L to initial luminance L0 to 95% took the longest period of time in the tandem white organic light emitting device D according to the present invention. Thus, it can be seen that device D has a longer lifespan than comparative devices A and C. The lifespan of device D is greater than that of device A by about 50% or more. In device D, the lifespan is increased since there is a low barrier difference between the p-type charge generation layer and the second hole transport layer, and an interface encountered by holes, which are transported to the second light emitting layer, is removed through removal of a buffer layer since the second hole transport layer is configured as a single layer between the p-type charge generation layer and the second light emitting layer.

In the above-described experiments, a blue fluorescent layer was used as the light emitting layer of the first stack (fluorescent stack), and a yellow-green phosphorescent layer was used as the light emitting layer of the second stack (phosphorescent stack) with reference to the cross-sectional view of FIG. 1 and energy levels of each of the layers shown in FIG. 8.

Hereinafter, structures of devices used in the following experiments will be briefly described. Comparative device C has the same structure as device D according to the present invention, except that a buffer layer formed of NPD and functioning as a hole transport layer is further interposed between the p-type charge generation layer and the second hole transport layer in addition to the second hole transport layer. Comparative device B has the same structure as device D according to the present invention, except that the p-type charge generation layer is formed of a single organic material. Thus, a detailed description of devices B and C will not be given.

In addition, device A has the same structure as device B, except that a buffer layer formed of NPD and functioning as a hole transport layer is further disposed therein. Thus, a detailed description thereof will not be given.

Experimental Example of Device D

Hereinafter, formation of the tandem white organic light emitting device D according to the present invention will be briefly described.

However, this is an example, and materials described below are not limited thereto. Any other materials may also be used as long as the materials maintain functions of the layers.

A thin film transistor array including a thin film transistor (not shown) aligned in each of the pixels in a matrix form is formed on a transparent substrate (not shown).

Then, as shown in FIGS. 1 and 8, a first electrode 110 is formed using an anode material to be in contact with the thin film transistor. Indium tin oxide (ITO) is generally used as the anode material.

Then, a first hole transport layer 120 is formed on the first electrode 110. The first hole transport layer 120 is formed by continuously depositing HAT-CN (Formula 1) to a thickness of 50 Å, 4,4'-bis[N-1-naphthyl)-N-phenylamino]-biphenyl (NPD, Formula 2) and N,N'-diphenyl-N-naphthyl-N'-biphenyl-1,1'-biphenyl-4,4"-diamine) to a thickness of 1600 to 1700 Å, and TCTA (Formula 3) or a material having electron or exciton blocking capabilities and identical to a material of the second hole transport layer, which will be described later, to a thickness of 200 Å.

Then, a first light emitting layer 130 emitting blue fluorescent light is formed on the first hole transport layer 120. The first light emitting layer 130 includes AND (Formula 4) and tBu-Perylene (Formula 5) and has a thickness of about 250 Å.

Then, a first electron transport layer 140 is formed on the first light emitting layer 130. The first electron transport layer 140 is an LGC ETL (Formula 6) having a thickness of about 250 Å.

Then, an n-type charge generation layer 151 and a p-type charge generation layer 152 are sequentially deposited. The n-type charge generation layer 151 is formed of BPhen (Formula 7) doped with 3% of lithium and has a thickness of about 100 Å. The p-type charge generation layer 152 is formed using a hole transporting material having electron or exciton blocking capabilities, as an organic host, doped with 10 to 20% of a p-type organic dopant and has a thickness of about 100 Å.

Then, a second hole transport layer 160 is formed on the p-type charge generation layer 152 using the same material as the organic host. The second hole transport layer 160 is deposited to a thickness of about 500 Å to 700 Å.

Then, a second light emitting layer 170 is formed on the second hole transport layer 160. The second light emitting layer is formed as a light emitting layer including BAlq (Formula 8) and a YG dopant (Formula 9) to a thickness of about 300 Å.

Then, a second electron transport layer 180 is formed on the second light emitting layer 170. The second electron transport layer 180 is formed by deposition of an LGC ETL to a thickness of about 350 Å. Continuously, LiF is deposited to a thickness of about 10 Å to form an electron injection layer 185.

Then, a second electrode 190 is formed as a cathode using a reflective metal such as Al on the electron injection layer 185 formed of LiF.

Formula 1
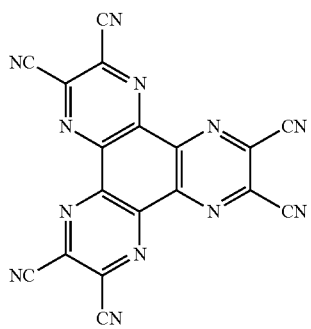
Formula 2
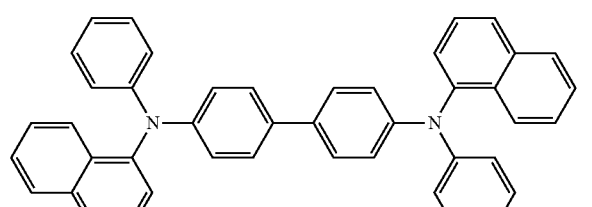
Formula 3
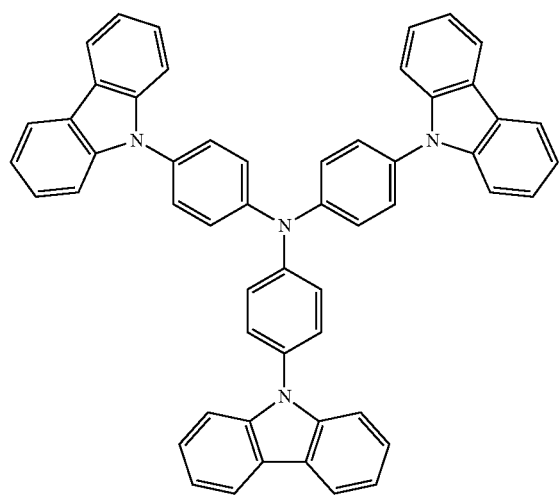
Formula 4
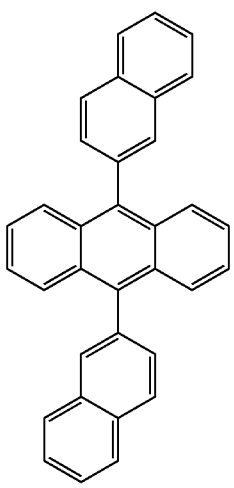
Formula 5
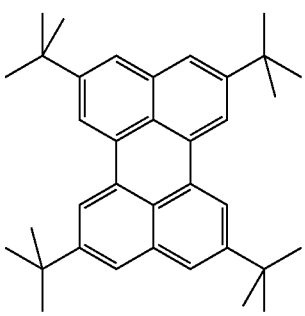
Formula 6
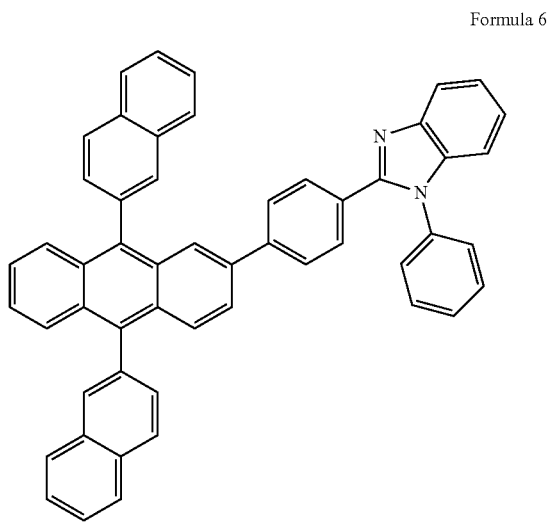
Formula 7
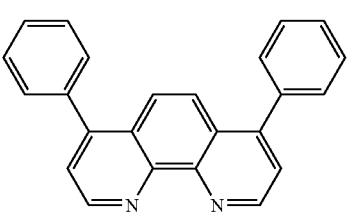
Formula 8
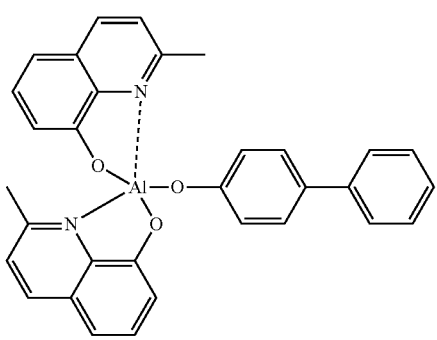

Formula 9

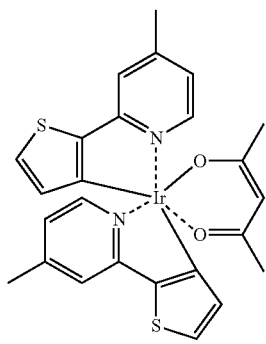

In the p-type charge generation layer according to the above-described embodiment, the organic host has a HOMO level of about −5.5 eV, the organic dopant has a LUMO level of about −5.2 eV, and the second hole transport layer adjacent thereto has a HOMO level of about −5.5 eV. A difference between the HOMO level of the second hole transport layer and the LUMO level of the organic dopant is about 0.3 eV, and the HOMO level of the second hole transport layer is the same as the HOMO level of the organic host. Effects as shown in Table 2 were confirmed according to the experimental example. However, embodiments of the present invention are not limited thereto. The HOMO level of the second hole transport layer may have a difference of about 0.5 eV from the HOMO level of the organic host and the LUMO level of the organic dopant.

In the tandem white organic light emitting device according to the present invention, the n-type charge generation layer has an organic host-organic n-type dopant structure or an organic host-alkali metal or alkaline earth metal dopant structure, and the p-type charge generation layer has an organic host-organic p-type dopant structure. In addition, a LUMO level of the p-type organic dopant is adjusted to be similar to a HOMO level of the second hole transport layer adjacent thereto, or a HOMO level of the p-type organic host is adjusted to be similar to a HOMO level of the second hole transport layer. As a result, holes may be efficiently transported to the second hole transport layer. That is, the tandem white organic light emitting device has a simplified structure and high hole transporting efficiency, since the second hole transport layer is formed without using a buffer layer formed of a hole transporting material and by preventing increase in driving voltage. Furthermore, inflow of electrons or excitons from the second light emitting layer into the charge generation layer is prevented by forming the second hole transport layer using an electron or exciton blocking material as a single layer, thereby improving light emission efficiency. Thus, the tandem white organic light emitting device has long lifespan and high efficiency.

Conventional tandem white organic light emitting devices have 14 layers in total. However, the tandem white organic light emitting device according to the present invention has 12 to 13 layers in total. As a result, the structure of the tandem white organic light emitting device may be simplified. Technical problems described above may be overcome by combination with a metal-doped n-type charge generation layer or an organic host-dopant n-type charge generation layer, thereby obtaining a device having high efficiency, low driving voltage, and long lifespan.

Meanwhile, in comparative device B having the above-described structure, driving voltage may be reduced and efficiency may be improved to be similar to those of comparative device A using the p-type charge generation layer formed of a single organic material by varying materials of the hole transport layer, and research on the materials have been conducted.

The tandem white organic light emitting device according to the present invention has the following effects.

First, since the charge generation layer that is formed at an interface between adjacent stacks is configured by stacking an n-type charge generation layer and a p-type charge generation layer to obtain diode effects, electrons or holes are not trapped in the charge generation layer, improving efficiencies of transporting electrons or holes into adjacent stacks.

Second, since the second hole transport layer having a single layer structure is formed to directly contact the p-type charge generation layer, use of a separate buffer layer between the p-type charge generation layer and the second hole transport layer may be reduced so as to simplify the manufacturing process, and the interface may be reduced so as to reduce obstacles to hole transport. As a result, use of organic materials and efficiency may be improved.

Third, since the p-type charge generation layer is formed of organic materials only, and a difference between the HOMO level of the second hole transport layer and the LUMO level of at least one organic material contained in the p-type charge generation layer is adjusted to be 0.5 eV or less, hole transport efficiency into the second light emitting layer, driving voltage characteristics and lifespan may be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A tandem white organic light emitting device comprising:
   a first electrode and a second electrode opposite to each other;
   a charge generation layer consisting of an n-type charge generation layer and a p-type charge generation layer stacked between the first electrode and the second electrode;
   a first stack disposed between the first electrode and the n-type charge generation layer and comprising a first hole transport layer, a first light emitting layer emitting blue light, and a first electron transport layer; and
   a second stack disposed between the p-type charge generation layer and the second electrode and comprising a second hole transport layer directly contacting the p-type charge generation layer and having a single layer structure, a second light emitting layer doped with a phosphorescent dopant to emit light with a longer wavelength than that of blue light, and a second electron transport layer,
   wherein the p-type charge generation layer is formed of organic materials only, and at least one organic material contained in the p-type charge generation layer has a LUMO level of −6.0 eV to −4.5 eV,
   wherein the second hole transport layer has a HOMO level different from the LUMO level of the at least one organic material contained in the p-type charge generation layer by 0.5 eV or less.

2. The tandem white organic light emitting device according to claim 1, wherein the p-type charge generation layer comprises:

an organic dopant having a LUMO level of −6.0 eV to −4.5 eV, wherein the LUMO level is the same as a HOMO level of the second hole transport layer or different from the HOMO level of the second hole transport layer by 0.5 eV or less; and an organic host having a HOMO level of −6.0 eV to −4.5 eV, wherein the HOMO level is the same as the HOMO level of the second hole transport layer or different from the HOMO level of the second hole transport layer by 0.5 eV or less.

3. The tandem white organic light emitting device according to claim 2, wherein the organic host is formed of the same material as is used to form the second hole transport layer.

4. The tandem white organic light emitting device according to claim 2, wherein the HOMO level of the organic host has a greater absolute value than a LUMO level of the organic dopant.

5. The tandem white organic light emitting device according to claim 1, wherein the second hole transport layer has a triplet energy level of 2.5 eV or greater.

6. The tandem white organic light emitting device according to claim 1, wherein the p-type charge generation layer has a thickness of 100 Å to 300 Å.

7. The tandem white organic light emitting device according to claim 1, wherein the second hole transport layer has a thickness of 300 Å to 700 Å.

8. The tandem white organic light emitting device according to claim 1, wherein the p-type charge generation layer is formed of a single organic material having a LUMO level of −6.0 eV to −4.5 eV, wherein the LUMO level is the same as a HOMO level of the second hole transport layer or different from the HOMO level of the second hole transport layer by 0.5 eV or less.

9. The tandem white organic light emitting device according to claim 1, wherein the n-type charge generation layer comprises a heterocyclic ring compound doped with a Group 1 A metal or a Group 2A metal.

10. The tandem white organic light emitting device according to claim 9, wherein the n-type charge generation layer has a thickness of 50 Å to 200 Å.

11. The tandem white organic light emitting device according to claim 9, wherein the doped metal comprises lithium, sodium, magnesium, calcium, or cesium.

12. The tandem white organic light emitting device according to claim 9, wherein an amount of the metal doped in the n-type charge generation layer is in the range of 1% to 10% based on the total volume of the n-type charge generation layer.

13. The tandem white organic light emitting device according to claim 1, wherein the second hole transport layer and the second electron transport layer have a triplet energy level greater than a triplet energy level of a host of the second light emitting layer by 0.01 eV to 1.2 eV.

14. The tandem white organic light emitting device according to claim 1, wherein the phosphorescent dopant of the second light emitting layer comprises a yellowish-green phosphorescent dopant.

15. The tandem white organic light emitting device according to claim 1, wherein the phosphorescent dopant of the second light emitting layer comprises a yellow phosphorescent dopant and a green phosphorescent dopant.

16. The tandem white organic light emitting device according to claim 1, wherein the phosphorescent dopant of the second light emitting layer comprises a red phosphorescent dopant and a green phosphorescent dopant.

* * * * *